United States Patent [19]
Chung

[11] Patent Number: 5,494,699
[45] Date of Patent: Feb. 27, 1996

[54] METHOD FOR THE FABRICATION OF ELECTROLUMINESCENCE DEVICE

[75] Inventor: Jae S. Chung, Seoul, Rep. of Korea

[73] Assignee: Goldstar Electron Co., Ltd., Choongchungbook-Do, Rep. of Korea

[21] Appl. No.: 357,281

[22] Filed: Dec. 13, 1994

[30] Foreign Application Priority Data

Dec. 14, 1993 [KR] Rep. of Korea ............... 27655/1993

[51] Int. Cl.$^6$ ................. B65D 5/12; C23C 14/34
[52] U.S. Cl. ............. 427/66; 204/192.1; 430/8; 430/320; 427/419.1; 427/419.2
[58] Field of Search ................. 427/66, 419.1, 427/419.2; 430/8, 320; 204/192.1

[56] References Cited

U.S. PATENT DOCUMENTS 4,416,933  11/1983  Anston et al. ............... 427/66
4,418,118  11/1983  Lindors ....................... 427/66
5,200,277  4/1993   Nakayama et al. ........... 427/66

*Primary Examiner*—Janyce Bell
*Attorney, Agent, or Firm*—Lowe, Price, LeBlanc & Becker

[57] ABSTRACT

There is provided a method for the fabrication of electroluminescence device, comprising the steps of: forming a lower electrode with a predetermined pattern on a substrate: forming a first insulation layer on the lower electrode atop the substrate, in a state of grounding the lower electrode; forming a luminescent layer on the first insulation layer; forming a second insulation film on the luminescent layer; and forming an upper electrode with a predetermined on the second insulation layer. For formation of the first insulation layer, a ferroelectric material is deposited by a sputtering process employing a sputtering apparatus consisting broadly of a vacuum chamber and an external limiter. The transparent lower electrode is electrically connected with the external limiter and grounded through it. In this condition, the electric potential which might be generated on the first insulation layer during its formation can be controlled, thereby preventing the darkening phenomenon of the transparent lower electrode.

1 Claim, 3 Drawing Sheets

METHOD FOR THE FABRICATION OF ELECTROLUMINESCENCE DEVICE

BACKGROUND OF THE INVENTION

1. Field of the invention

The present invention relates, in general, to a method for fabricating an electroluminescence device and, more particularly, to a method for the fabrication electroluminescence device employing a sputtering process to deposit a ferroelectric insulation layer on a transparent lower electrode of indium tin oxide grounded through an electrically connected limiter, preventive of darkening phenomenon of the transparent lower electrode.

2. Description of the Prior Art

Until recently, there was extensively used a cathode ray tube (hereinafter referred to as "CRT") as a information display device. To date, as the information display device is strongly required to be more light, more solid and more flat, research and development for next generation information display devices has actively proceeded. As a result, an electroluminescence device, a liquid crystal display, a light emitting diode, and a plasma display panel were developed.

Among such information display devices, particularly, an electroluminescence device, an active solid display device in which hot electrons produced by high electric field may be interacted with a luminescent center to emit light, largely attracts scientific and commercial attention and its development is being watched with keen interest because it can have large display area and show superiority in luminance, color contrast and view angle.

Recently, in an electroluminescence device which is based on ZnS, respective luminances of yellow color and green color have been able to be obtained largely enough to put the etectroluminescence devices into practice but neither red color nor blue color has been able to be obtained enough.

To accomplish multicoloration yet high luminance in an electroluminescence device, active research and study has been directed to novel luminescent basic substances, for example, CaS and SrS luminescent phosphors, instead of the conventional basic substance, ZnS.

Meanwhile, a white light EL device, a newly developed device, in which double luminescent centers are added into alkali earth luminescent phosphor has been and continues to be actively researched. Since it is proved that the white light EL device is able to control three primary colors with a filter as well as be utilized as a monocolor display device, it significantly attracts attention.

Now, in order to better understand the background of the present invention, a description will be made for a conventional electroluminescence device and a method for fabricating the same, along with its problems.

Referring initially to FIG. 1, there is shown a structure of a conventional electroluminescence device. As shown in this figure, the conventional electroluminescence device has a substrate 1 on which a transparent lower electrode 2, a first insulation layer 3, a luminescent layer 4, a second insulation layer 5 and an upper electrode 6 are in sequence deposited between the lower and the upper electrodes 2, 6 formed with their respective predetermined patterns.

Following is of a fabrication method for the conventional electroluminescence device.

First, on a substrate 1, for example, a glass substrate, there is deposited with indium tin oxide (hereinafter referred to as "ITO") at a thickness of about 2,000 Angstrom which is then subjected to photolithography, to form a transparent lower electrode 2 of ITO having a predetermined pattern.

Subsequently, using a sputtering process, a material selected from a group consisting of, for example, $Y_2O_3$, $Si_3N_4$, $Ta_2O_5$, $SiO_2$, SiON, $SrTiO_3$, $BaTiO_3$, PLZT and $PbTiO_3$, is deposited in a thickness of about 3,000 to 5,000 Angstrom on the substrate 1 provided with the lower electrode 2, so as to form an first insulation layer 3.

For more detailed description of this sputtering process, reference is made to FIG. 2 which shows a sputtering apparatus for the conventional electroluminescence device. As shown in this figure, the sputtering apparatus for the conventional electroluminescence device comprises a vacuum chamber 11 in which a substrate holder 12 and a sputtering target holder 14 are provided at an upper portion and a lower portion, respectively. The sputtering target holder 14 secures a sputtering target 13. On the other hand, the substrate 1 is fixated at the substrate holder 12 in such a manner that the face of the substrate 1 carrying the lower electrode 2 is toward the sputtering target 13.

In this state, Ar, a process gas, and $O_2$ and $N_2$, reactive gases, are charged through an inlet (not shown) into the vacuum chamber 11. Application of a high electric field provided from an external power equipment (not shown) across the vacuum chamber, that is, to the substrate 1 and the sputtering target 13 produces plasma of the reactive gases, depositing the first insulation layer on the face of the substrate carrying the lower electrode 2.

Thereafter, using an electron beam evaporation or sputtering process, a ZnS, SrS or CaS-based luminescent layer 4 is deposited in a thickness of about 6,000 to 10,000 Angstrom on the first insulation layer 3, followed by deposition of a second insulation layer 5 in a thickness of about 3,000 to 5,000 Angstrom on the luminescent layer 4. The second insulation layer 5 is made of the same material as the first insulation layer 3.

Finally, a metal, for example, aluminum is deposited at a thickness of about 2,000 Angstrom on the second insulation layer 5 and then, is subjected to photolithography, to form an upper electrode 6 having a predetermined pattern.

In such conventional electroluminescence device fabricated, when both the lower electrode 2 and the upper electrode 6 are applied by an alternating current voltage which is large enough to generate a high electric field of 1 MV/cm or more thereacross, the electrons which are in an interface state between the first insulation layer 3 and the luminescent layer 4 and in an interface state between the second insulation layer 5 and the luminescent layer 4 are accelerated and thus transformed into so-called hot electrons with tunneling to a conduction band of the luminescent.

While a portion of the hot electrons impact upon a luminescent center, for example $Mn^{2+}$ doped in ZnS which is a base substance of the luminescent layer 4, to excite the luminescent center, a portion of the hot electrons ionizes the base substance, coupling with holes. As a result, electron-hole pairs are produced.

For a luminescent mechanism in the luminescence device, the electrons excited to the conduction band by the hot electrons fall into a valence band. In the meanwhile, a light corresponding to the same energy that difference between the conduction band and the valence band is emitted from the luminescent layer 4 through the substrate 1 to the outside of the electroluminescence device.

A significant disadvantage of the conventional fabrication method for luminescence device is that, when a ferroelectric material, for example, SrTiO₃, BaTiO₃, PLZT, or PbTiO₃, is deposited to form the first insulation layer 3, an electric potential arises on a surface of the ferroelectric first insulation layer 3, leading to darkening the transparent lower electrode 2. As a result, the quantity of the light emitted toward the outside comes to be reduced owing to this darkening phenomenon.

SUMMARY OF THE INVENTION

Therefore, an object of the present invention is to overcome the above problems encountered in prior arts and to provide a method for the fabrication of luminescence device, capable of preventing the darkening phenomenon in a lower electrode of the luminescence device and thus increasing quantity of light emitted toward the outside of the luminescence device.

Based on the through and intensive research and study by the present inventors, the above object of the present invention could be accomplished by a provision of a method for the fabrication of luminescence device, comprising the steps of: forming a lower electrode with a predetermined pattern on a substrate: forming a first insulation layer on the lower electrode atop the substrate, in a state of grounding the lower electrode; forming a luminescent layer on the first insulation layer; forming a second insulation film on the luminescent layer; and forming an upper electrode on the second insulation layer.

BRIEF DESCRIPTION OF THE INVENTION

The above object and other advantages of the present invention will become more apparent by describing in detail the preferred embodiment of the present invention with reference to the attached drawings in which.

DETAILED DESCRIPTION OF THE PREFERRED EMBODIMENTS

Figure 1:
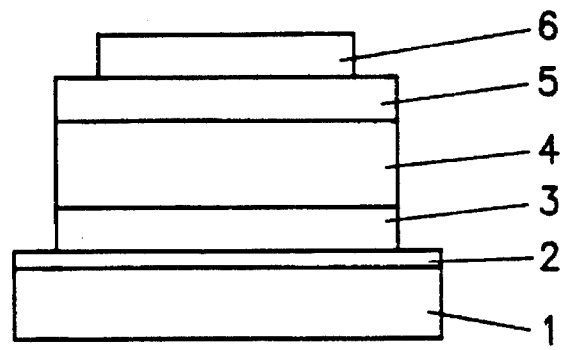
FIG. 1 is a schematic cross sectional view showing a structure of a conventional luminescence device.
Figure 2:
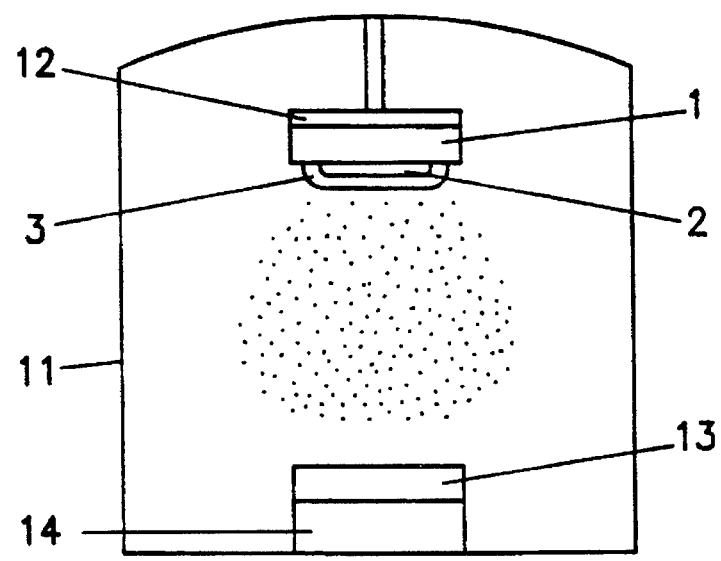
FIG. 2 is a schematic cross sectional view showing a sputtering apparatus used in conventional method for fabricating the luminescence device of FIG. 1.

The application of the preferred embodiments of the present invention is best understood with reference to the accompanying drawings, wherein like reference numerals are used for like and corresponding parts, respectively.

Figure 3:
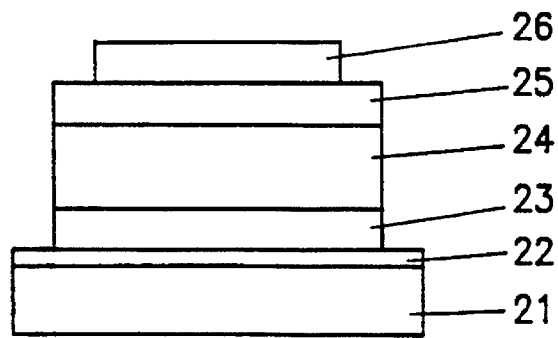
FIG. 3 is a schematic cross sectional view showing a structure of a luminescence device, according to the present invention.

Referring initially to FIG. 3, there is shown a structure of an electroluminescence device, according to the present invention. As shown in FIG. 3, the electroluminescence device of the present invention has a substrate 21 on which a transparent lower electrode 22, a first ferroelectric insulation layer 23, a luminescent layer 24, a second insulation layer 25 and an upper electrode 26 are in sequence deposited with the lower and the upper electrodes 22, 26 formed with their respective predetermined patterns.

A method for the fabrication of electroluminescence device according to the present invention will be now described in conjunction with the FIGS. 3 through 6.

First, on a substrate 21, for example, a glass substrate, there is deposited with an ITO layer which is then subjected to photolithography, to form a transparent lower electrode 22 of ITO having a predetermined pattern, in a similar manner to that of the above-mentioned conventional method.

Subsequently, using a sputtering process, a first insulation layer 23 is deposited on the substrate 21 provided with the transparent lower electrode 22. In the present invention, the first insulation layer is read of a material selected from a group consisting of Y₂O₃, Si₃N₄, Ta₂O₅, SiO₂, SiON, SrTiO₃, BaTiO₃, PLZT and PbTiO₃ and preferably made of a ferroelectric material consisting of SrTiO₃, BaTiO₃, PLZT and PbTiO₃.

Figure 4:
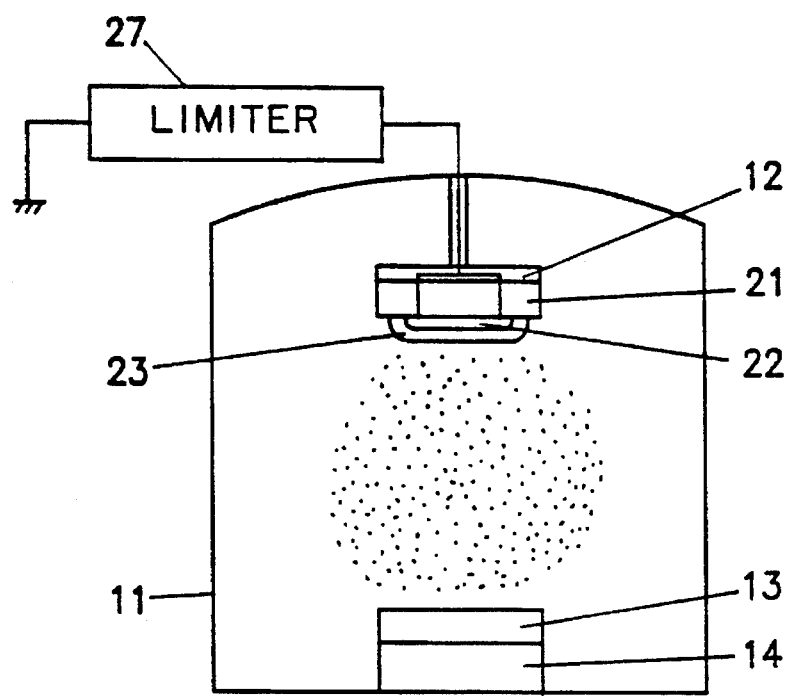
FIG. 4 is a schematic cross sectional view of a sputtering apparatus equipped with a limiter illustrating a method for fabricating the luminescence device, according to the present invention.

For more detailed description of the sputtering process according to the present invention, reference is made to FIG. 4 which shows a sputtering apparatus useful to fabricate an electroluminescence device of the present invention. As shown in this figure, the sputtering apparatus for the electroluminescence device of the present invention is similar to that for the above-mentioned conventional electroluminescence device, except that an external limiter 27 is provided, grounding the lower electrode 22 of the luminescence device therethrough.

Figure 6:
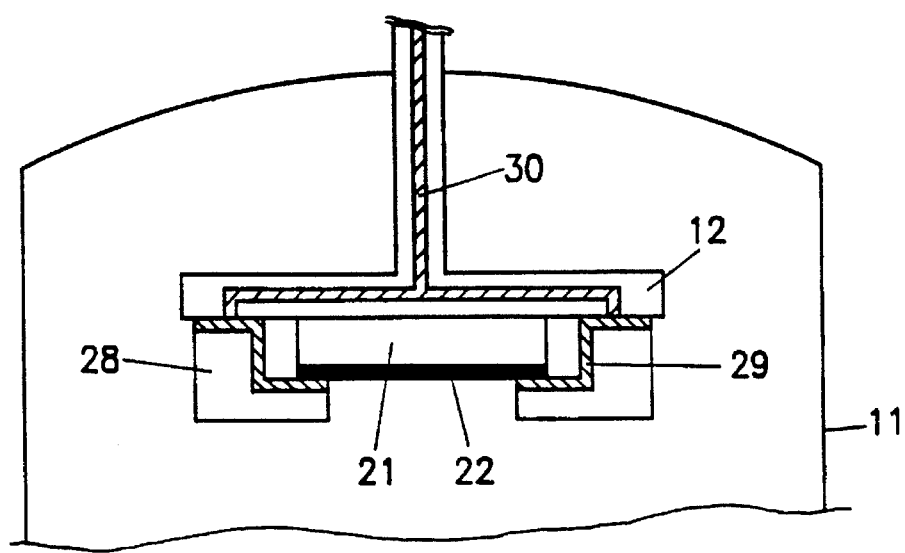
FIG. 6 is a fragmentary enlarged detail showing an earth state of a lower electrode to the limiter of FIG. 4.

Turning now to FIG. 6, there is in more detail shown the ground state of the low electrode 22. As shown in this drawing, a shadow mask 28 of stainless steel is affixed to the substrate holder 12, masking an area of the lower electrode 22 of the substrate 21. The shadow mask 28 has an upper surface on which a step portion is formed and an which a conductive layer 29, for example, is coated, so that it electrically connects all areas of the lower electrode 22 but an area in which the first insulation layer 23 is to be formed, with a connective line 30 which is provided inside the substrate holder 12. Therefore, the lower electrode 22 comes to have an electric connection with the external limiter of the vacuum chamber 11, through the connective line 30.

In this state, Ar, a process gas, and O₂ and N₂, reactive gases, are charged through an inlet (not shown) into the vacuum chamber 11. Application of a high electric field provided from an external power equipment (not shown) across the vacuum chamber, that is, to the substrate 21 and the sputtering target 13 produces plasma of the reactive gases, depositing the first insulation layer 23 on the face of the substrate carrying the lower electrode 22.

It should be noted that the electric potential generated on the first insulation layer 23 which is being deposited is grounded through a electric path consisting of the lower electrode, the conductive layer 29 and the limiter 27, according to the present invention.

Figure 5:
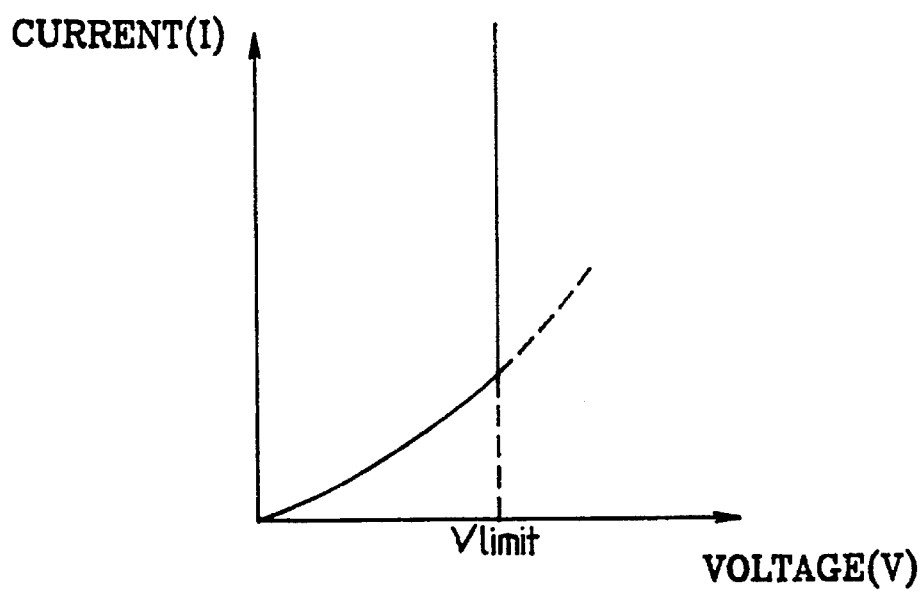
FIG. 5 is a graph showing current-voltage characteristics of the limiter of FIG. 4.

With reference to FIG. 5, there is shown a current-voltage characteristic of the limiter 27 which is a general device consisting of a Zener diode and resistance. As shown in FIG. 5, current (I) flowing through the limiter 27 increases with voltage (V) yet ceases to increase when voltage reaches a limit value ($V_{limit}$).

From this current-voltage characteristic of the limiter 27, it is apparent that, although the first insulation film 23 of the above-mentioned ferroelectric material is deposited on the lower electrode 22 of transparent ITO, the lower electrode 22 is not darkened.

Thereafter, using an electron beam evaporation or sputtering process, a ZnS, SrS or CaS-based luminescent layer 24 is deposited in a thickness of about 6,000 to 10,000 Angstrom on the first insulation film 23, followed by deposition of a second insulation layer 25 which is made of the same ferroelectric material as the first insulation layer on the luminescent layer 4.

Finally, a metal, for example, aluminum is deposited on the second insulation layer 25 and then, is subjected to photolithography, to form an upper electrode 26 having a predetermined pattern.

As described hereinbefore, a ferroelectric, first insulation layer is formed on a transparent lower electrode of ITO in such a sputtering process that the transparent lower electrode of ITO is grounded through an external limiter having an electric connection with the lower electrode, thereby preventing darkening the transparent lower electrode of ITO during its formation, in accordance with the method of the present invention. In addition, the method of the present invention is capable of controlling the electric potential of the transparent first insulation layer, thereby forming the first insulation layer quality.

Other features, advantages and embodiments of the invention disclosed herein will be readily apparent to those exercising ordinary skill in the art after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for the fabrication of an electroluminescence device, comprising the steps of:

depositing an ITO (indium-tin oxide) transparent layer on a transparent substrate;

patterning said ito transparent layer into electrode patterns by photolithography;

depositing a first insulating layer on said ITO electrode, wherein said ITO electrode is grounded through a limiter;

depositing a luminescent layer on said first insulating layer;

depositing a second insulating layer on said luminescent layer; and depositing a metal electrode layer on said second insulating layer.

\* \* \* \* \*